United States Patent [19]

Gesche et al.

[11] Patent Number: 5,049,840
[45] Date of Patent: Sep. 17, 1991

[54] COOLING DEVICE FOR ELECTRICAL CIRCUIT CONFIGURATIONS

[75] Inventors: Roland Gesche, Seligenstadt; Stefan Locher, Alzenau, both of Fed. Rep. of Germany

[73] Assignee: Leybold Aktiengesellschaft, Fed. Rep. of Germany

[21] Appl. No.: 458,328

[22] Filed: Dec. 28, 1989

[30] Foreign Application Priority Data

Aug. 18, 1989 [DE] Fed. Rep. of Germany ....... 3927324

[51] Int. Cl.[5] ..................... H03H 7/38; H03H 1/00
[52] U.S. Cl. .................... 333/32; 333/22 F; 336/62
[58] Field of Search ........... 333/22 F, 32, 234, 99 PL; 336/62

[56] References Cited

U.S. PATENT DOCUMENTS

| 1,753,408 | 4/1930 | Gebhard | 336/62 |
| 1,817,247 | 8/1931 | Gebhard | |
| 1,882,075 | 10/1932 | Gebhard | 336/62 |
| 4,207,137 | 6/1980 | Tretola | |

FOREIGN PATENT DOCUMENTS

| 491342 | 2/1930 | Fed. Rep. of Germany |
| 508106 | 9/1930 | Fed. Rep. of Germany |
| 551100 | 5/1932 | Fed. Rep. of Germany |
| 562318 | 10/1932 | Fed. Rep. of Germany |
| 1640767 | 3/1971 | Fed. Rep. of Germany |
| 2553614 | 6/1977 | Fed. Rep. of Germany |
| 3638880 | 5/1987 | Fed. Rep. of Germany |

Primary Examiner—Paul Gensler
Attorney, Agent, or Firm—Killworth, Gottman, Hagan & Schaeff

[57] ABSTRACT

The invention relates to a cooling device for circuit configurations in which high electrical energies are converted and specifically for electrical matching circuits with which the impedance of a plasma path is matched to a high frequency generator. Herein one or several coils are provided with a water cooling system in such a way that the cooling water is completely separated from the electromagnetic fields through metallic material. These coils consist of two tubes slid one into the other, wherein the cooling water is fed and drawn through the internal tube and between the two tubes so that it is completely within the field-free region.

4 Claims, 3 Drawing Sheets

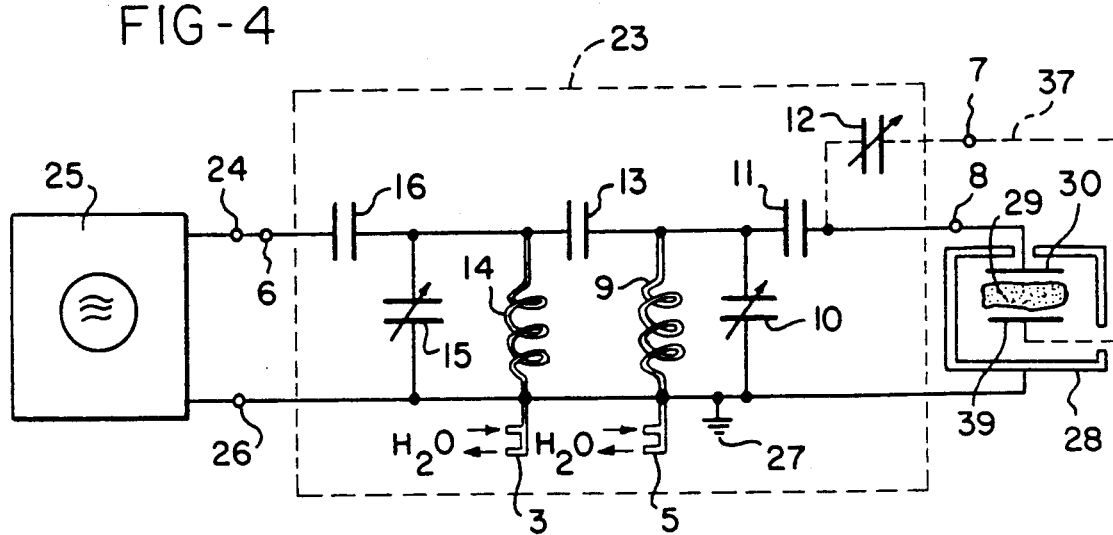
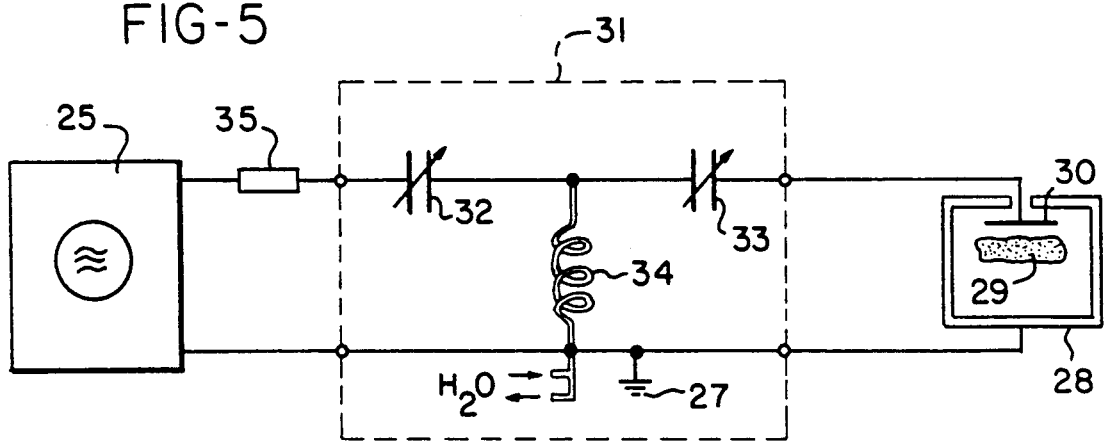

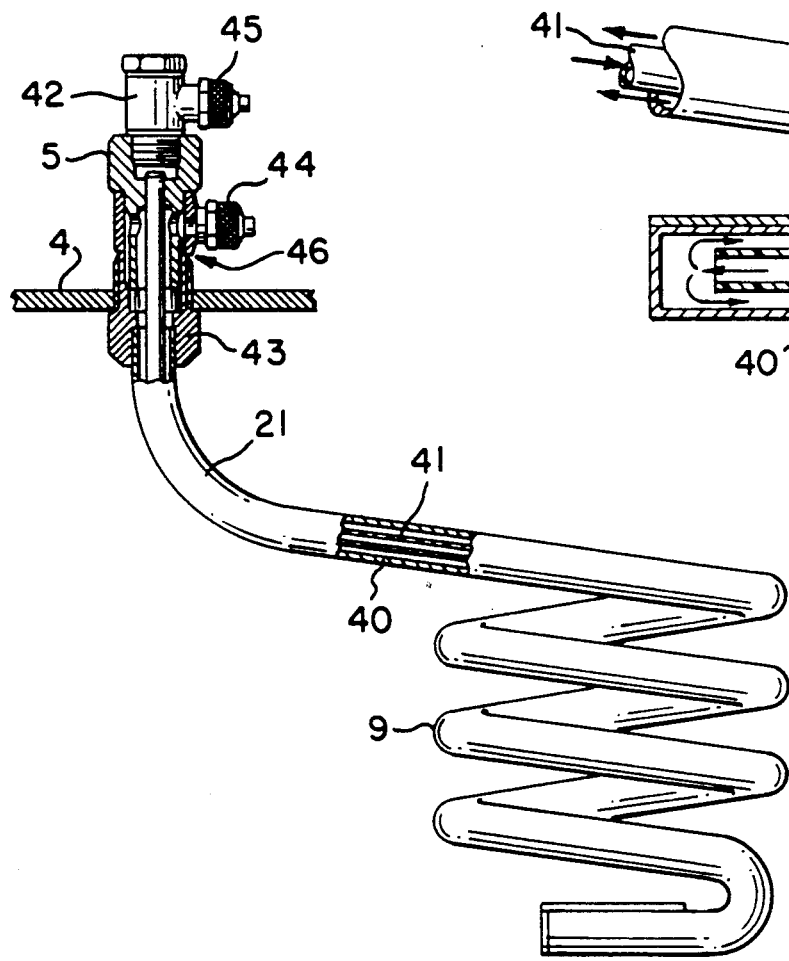
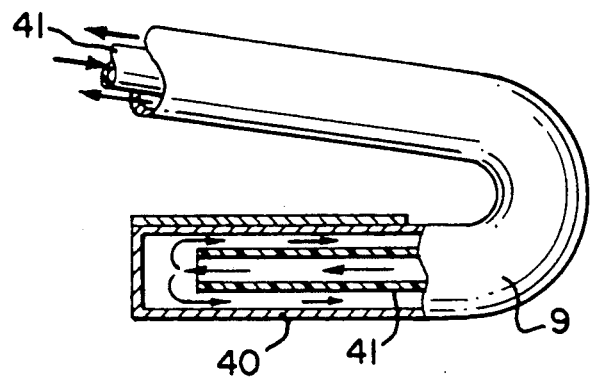
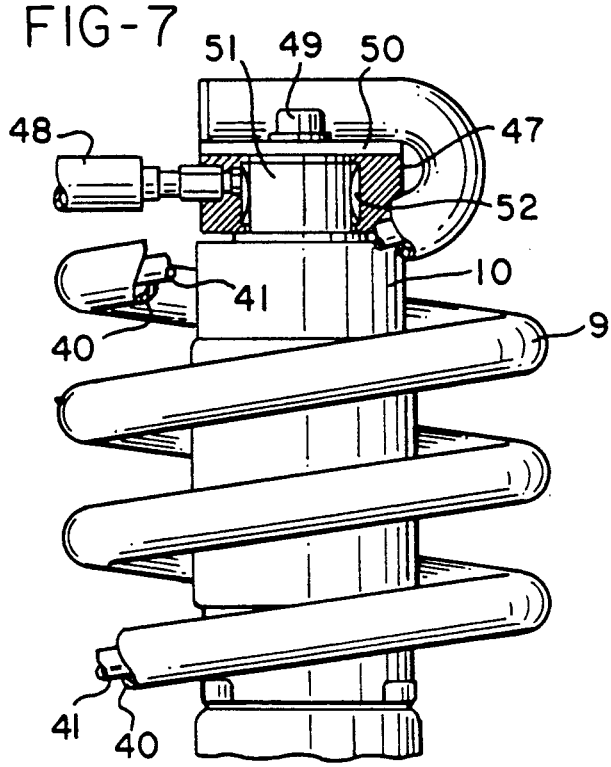
FIG-6
FIG-6A
FIG-7

COOLING DEVICE FOR ELECTRICAL CIRCUIT CONFIGURATIONS

BACKGROUND OF THE INVENTION

The invention relates to a cooling device for electrical circuit configurations.

Electrical and electronic structural elements heat up during operation due to the occurring power dissipation. Heating therein as a rule is greater the higher the converted electrical power. To eliminate the heat from the particular structural element, different methods are possible. With electronic amplifiers in which power transistors become strongly heated, cooling fins and slots or Peltier cooling elements are used. These methods of cooling rest in principle on the use of air as means of heat dissipation. For fast and intensive cooling, however, air is often not sufficient. In these cases use is made of the known water cooling which is applied for example with most Otto engines.

The cooling of passive electrical structural elements such as coils and capacitors presents a special problem since these elements generate magnetic or electrical fields during operation which can act like interference fields. Such coils and capacitors are employed, for example, in matching circuits for plasma paths wherein these matching circuits are disposed between a high frequency generator and the plasma path (cf. DE-OS 36 38 880; U.S. Pat. No. 4,207,137; J. Electrochem. Soc. Solid State Science, Vol. 114, No. 5, 1967, pages 505 to 508; J. Vac. Sci. Technol. B 5 (3), May/June 1987, page 647). The power converted in these coils and capacitors often amounts to a few hundred kilowatts or more so that coils and capacitors heat up strongly and can potentially be destroyed.

To cool for example the coils in the high frequency power range the coils are implemented as cylindrical coils which are wound from a tube. For cooling purposes a fluid is conducted through the tube.

Since at least one terminal of the coil has a potential relative to ground, the cooling fluid flowing in and out at this place is likewise at the potential. As a rule water is used as cooling fluid which has a greater or lesser degree of conductivity. Hereby a filled cooling hose connected to the coil represents an effective resistance relative to ground. This resistance must be as large as possible so that the degree of efficiency of the circuit is not significantly impaired and thermal damages to the cooling water hose are avoided. To this end, as feed lines carrying cooling water to the high-voltage connections one to two meters of plastic or Teflon hose are customarily used. This hose is rolled up and secured within the HF shielding where it functions as a degradation path. However, since water also represents a dielectric with losses, the HF fields couple into the cooling water and thereby convert electrical energy into heat energy; the water thus acts as an absorber. Therewith two contradictory requirements are presented: water hoses of maximum length for high-ohmic loading of the electrical connection, and a minimum amount of water because of the absorbing effect on the electromagnetic fields. These two demands are not at all or hardly ever consistent with conventional methods.

The invention is therefore based on the task of effectively cooling electrical structural elements and to achieve simultaneously a high-ohmic load of the electrical connection without allowing large electrical losses to occur.

SUMMARY OF THE INVENTION

This task is solved according to the features of the present invention.

The advantage achieved with the invention consists in particular in that matching circuits and similar circuits with high degrees of efficiency can be constructed to be small and cost-effectively. No water degradation paths are present so that the conductivity of the cooling water does not matter.

Embodiment examples of the invention are represented in the drawing and are described below in greater detail.

BRIEF DESCRIPTION OF THE DRAWINGS

FIG. 4 is a first matching circuit in which the cooling device according to the invention can be used;

FIG. 5 is a second matching circuit in which the cooling device according to the invention can be used;

FIG. 6 is a detail representation of a water-cooled coil; and

FIG. 6A is a broken away end section of the water-cooled coil of FIG. 6 showing the reversal in the flow of the water thereat;

FIG. 7 is a further detailed representation of a water-cooled coil.

DETAILED DESCRIPTION OF THE INVENTION

Figure 1:
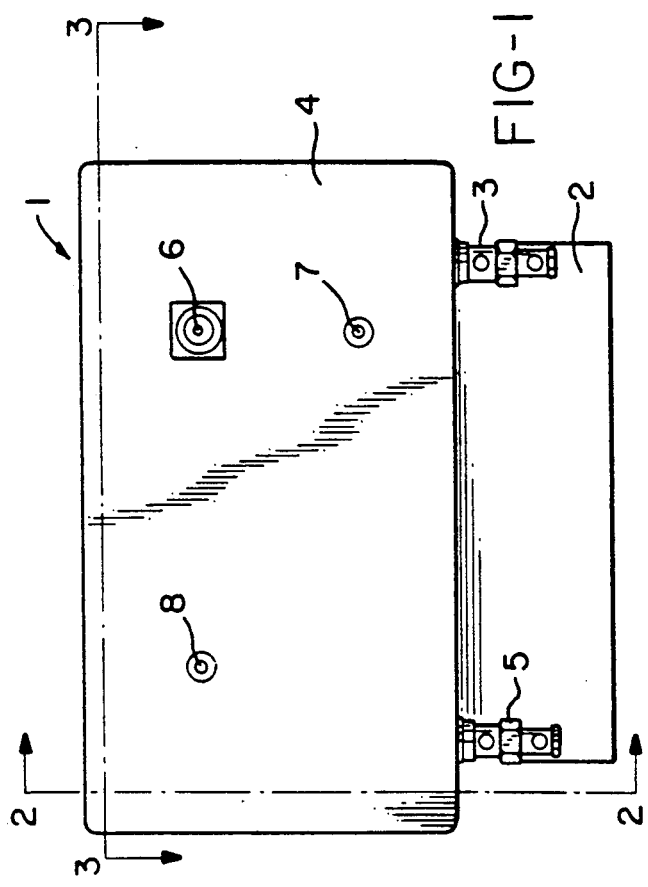
FIG. 1 represents a view onto the long side of the housing of a matching circuit.

In FIG. 1 a housing 1 is shown in which is located a water-cooled matching circuit. The housing includes an upper part 4 and beneath it a container 2 in front of which a water connecting piece 3 is provided which leads into the upper part 4 of housing 1. The container 2 receives printed circuits and capacitor control motors which are unimportant to the present invention and will not be shown or described herein. A second water connecting piece 5 is disposed at a predetermined distance from the water connecting piece 3. Electrical connecting pieces 7, 8 are connected for example to a plasma path not shown in FIG. 1, i.e. the electrical connecting pieces 7, 8 represent so to speak the output of a matching quadrupole. The input of this quadrupole which is connected to a high frequency generator 25, see FIGS. 4 and 5, is represented by the terminal 6 on the front side of the upper part 4 of the housing 1.

Figure 2:
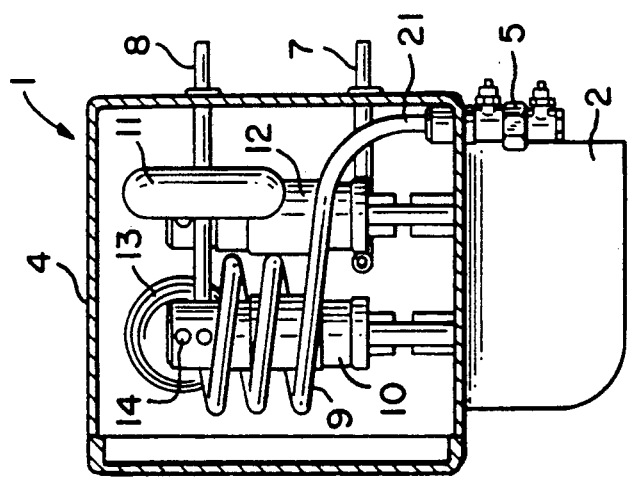
FIG. 2 is a sectional view of the narrow side of the housing of a matching circuit.

FIG. 2 shows the housing 1 of FIG. 1 in section as viewed onto the narrow side. A coil 9 can be recognized representing an element of a parallel resonant circuit. The other element of this parallel resonant circuit, a variable capacitor 10, is disposed within this coil 9. This is a vacuum capacitor in cylindrical shape. A series capacitor 11 lies in the series arm of the matching circuit and is connected to terminal 8 which is the output of the matching circuit. A further variable capacitor 12 for coupling out a bias voltage is disposed to the right of the capacitor 10. A series capacitor 13, disposed as is the series capacitor 11 in the series arm of the matching circuit, is connected via a line 36 with the variable capacitor 10.

Figure 3:
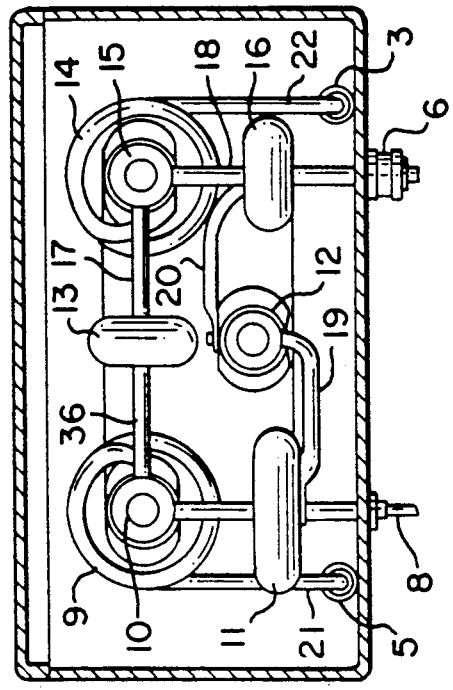
FIG. 3 is a sectional view of the long side of the housing of a matching circuit.

In FIG. 3 a top view onto the matching circuit is shown which contains, apart from the parallel coil 9, a further parallel coil 14, in which is located a parallel capacitor 15. This parallel capacitor 15 is connected to a series capacitor 16 which is connected to terminal 6. Between the capacitors 13 and 15 as well as between the capacitors 15 and 16 electrical connection lines 17, 18 are provided. Further electrical connection lines 19, 20 lead from capacitor 11 to capacitor 12 and respectively from capacitor 12 to terminal 7 which is a bias output of the matching circuit.

The end 21 of coil 9 is connected with the water connecting piece 5 only the rear of which is visible in FIG. 3. The analogous is true for end 22 of coil 14 which is connected to the water connecting piece 3.

The entire matching circuit 23 is shown in FIG. 4 again as a circuit diagram. It can herein be seen that the capacitor 16 is connected through terminal 6 to one output 24 of the high frequency generator 25 whose second output 26 is connected to ground 27 and to the housing 28 of a plasma chamber in which the plasma 29 is located. The capacitor 16 is followed by a parallel resonant circuit 15, 14 which contains the variable capacitor 15. This parallel resonant circuit 15, 14 is followed by the series capacitor 13 which, in turn, is followed by a parallel resonant circuit 9, 10. Between this parallel resonant circuit 9, 10 and the output terminal of the matching circuit 23 is located the series capacitor 11. The output terminal 8 is connected to an electrode 30 of the plasma chamber. The coils 9 and 14 are represented as cooled coaxial tubes. In bias operation indicated by the dashed line 37, a further electrode 39, most often realized by a substrate plate of the plasma chamber, is operated in the vacuum chamber with a portion of the HF power. The capacitor 12 serves as a bias capacitor to obtain a further regulatable output for a portion of the HF power.

In FIG. 5 is shown a further matching circuit 31 containing two variable capacitors 32, 33 in the series arm and a fixed coil 34 in the shunt branch. Reference number 35 indicates the output impedance of the high frequency generator 25. The coil 34 is shown in FIG. 5 as a water-cooled coil in accordance with the present invention.

FIG. 6 shows the coil 9 of FIG. 2 once again in detail, wherein an external tube 40 and an internal tube 41 are evident. The inductance is formed by the external tube 40 of the coaxial system. The electrical connection to ground is produced by the threaded union 5 with the housing 4 and by the connection piece to the capacitors. The internal tube 41 has no electrical function but rather functions only to transport the cooling water and is preferably formed of plastic, Teflon or other appropriate nonmetallic material. The cooling water is fed into the coil 9 via a first water rise connector 45 of a connecting piece 42. A through connect 43 is used for grounding the external tube 40. After traveling through the internal tube 41 in a first direction away from the connecting piece 42, the cooling water exits the internal tube 41 and flows in a second direction opposite to the first direction toward a second water hose connector 44 of a swivel joint connecting piece 46 as best shown in FIG. 6A.

In FIG. 7 the upper part of coil 9 is represented with which the coil 9 is secured against a contact ring 47. This contact ring 47 is, in turn, connected to an electrical lead 48 and surrounds an electrical contact 52 which in turn surrounds a cylindrical projection 51 at the upper portion of the capacitor 10.

The heat of the vacuum capacitor 10 is transferred by heat conduction to the contact ring 47 which is connected with the end of the coaxial tube 9, 40, 41 via a flange 50 and a connection element member 49 and is thereby cooled.

What is claimed is:

1. A cooling device for a high frequency inductance coil comprising two tubes which are at least in part coaxially arranged with each other to thereby define an outer tube and an inner tube, said outer tube consisting of metallic material, cooling liquid flowing in said inner tube in a first direction and in the space between said inner tube and said outer tube in a second direction opposite to said first direction, said outer tube being connected to an electrical potential, characterized in that said outer tube is connected to ground potential at an opening whereat said liquid enters into or exits from said inductance coil.

2. A cooling device as claimed in claim 1, characterized in that said inductance coil is associated with a vacuum capacitor having a cylindrical shape and being disposed within said inductance coil.

3. A cooling device as claimed in claim 1, characterized in that said inductance coil is wound cylindrically and has a round conductor cross section.

4. A cooling device as claimed in claim 1, characterized in that said inner tube comprises a plastic hose.

* * * * *